(12) United States Patent
Koch et al.

(10) Patent No.: US 11,906,568 B2
(45) Date of Patent: Feb. 20, 2024

(54) MONITORING ARRANGEMENT FOR ELECTRICAL EQUIPMENT, AND MONITORING SYSTEM

(71) Applicant: Siemens Energy Global GmbH & Co. KG, Munich (DE)

(72) Inventors: Thomas Koch, Brieselang (DE); Bastian Robben, Berlin (DE); Matthias Schubert, Berlin (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 149 days.

(21) Appl. No.: 17/618,595

(22) PCT Filed: May 25, 2020

(86) PCT No.: PCT/EP2020/064385
§ 371 (c)(1),
(2) Date: Dec. 13, 2021

(87) PCT Pub. No.: WO2020/249379
PCT Pub. Date: Dec. 17, 2020

(65) Prior Publication Data
US 2022/0357388 A1    Nov. 10, 2022

(30) Foreign Application Priority Data
Jun. 12, 2019    (DE) .................... 10 2019 208 520.2

(51) Int. Cl.
*H01H 31/12*  (2006.01)
*G01R 31/14*  (2006.01)
*G01R 31/12*  (2020.01)

(52) U.S. Cl.
CPC ......... *G01R 31/14* (2013.01); *G01R 31/1236* (2013.01)

(58) Field of Classification Search
CPC ............ G01R 31/1236; G01R 31/1245; G01R 31/12; G01R 31/14; G01R 31/52; G01R 31/54; G01R 31/56; G01R 31/58; G01R 31/62; G01R 15/142; G01R 15/146; G01R 15/16
See application file for complete search history.

(56) References Cited

U.S. PATENT DOCUMENTS 6,433,989 B1 *  8/2002  Hinrichsen ............. H01C 7/12
                                                            361/127
7,005,863 B2    2/2006  Gudmundsson et al.
(Continued)

FOREIGN PATENT DOCUMENTS

CN          2386448 Y       7/2000
CN          107195406   *   9/2017
(Continued)

OTHER PUBLICATIONS

Siemens, "Sensformer_Data Sheet_Outdoor Version_V1.1", Installation type / Mounting: Design—Data acquisition unit, outdoor version, p. 1-2.
(Continued)

*Primary Examiner* — Thang X Le
(74) *Attorney, Agent, or Firm* — Laurence A. Greenberg; Werner H. Stemer; Ralph E. Locher

(57) ABSTRACT

A monitoring arrangement for electrical equipment includes a first sensor for sensing a surface creeping current on a creeping path-lengthening electrically insulating housing of the equipment. A monitoring system includes electrical equipment, the monitoring arrangement, a communication device for transmitting data to a central server device, and a central server device configured to receive and evaluate the data.

20 Claims, 1 Drawing Sheet

(56) References Cited

U.S. PATENT DOCUMENTS

| | | | |
|---|---|---|---|
| 2015/0168472 A1* | 6/2015 | Phillips | G01R 31/1245 |
| | | | 324/551 |
| 2016/0265978 A1* | 9/2016 | Khatri | G01K 1/14 |
| 2017/0108550 A1 | 4/2017 | Raschke | |
| 2018/0106850 A1 | 4/2018 | Coulloudon et al. | |
| 2018/0108461 A1 | 4/2018 | Rostron et al. | |
| 2018/0348289 A1* | 12/2018 | Tillotson | G01R 31/008 |
| 2021/0349139 A1* | 11/2021 | Kronenberger | G01R 31/006 |
| 2022/0129865 A1* | 4/2022 | Armschat | G06Q 50/06 |

FOREIGN PATENT DOCUMENTS

| | | |
|---|---|---|
| DE | 60225246 T2 | 3/2009 |
| DE | 102015013433 B3 | 1/2017 |
| DE | 102015017168 B4 | 8/2017 |
| EP | 0996956 B1 | 1/2003 |
| WO | WO 2020007574 A1 | 1/2020 |
| WO | WO 2020114593 A1 | 6/2020 |

OTHER PUBLICATIONS

Siemens, "Sensformer_Data Sheet_Outdoor Version_V1.1", Installation type / Mounting: Design—Data acquisition unit, built-in version, p. 1-2.

Siemens, "ACM Brochure", www.siemens.com/energy/arresters, A full range of monitoring solutions for surge arresters, p. 1-12.

* cited by examiner

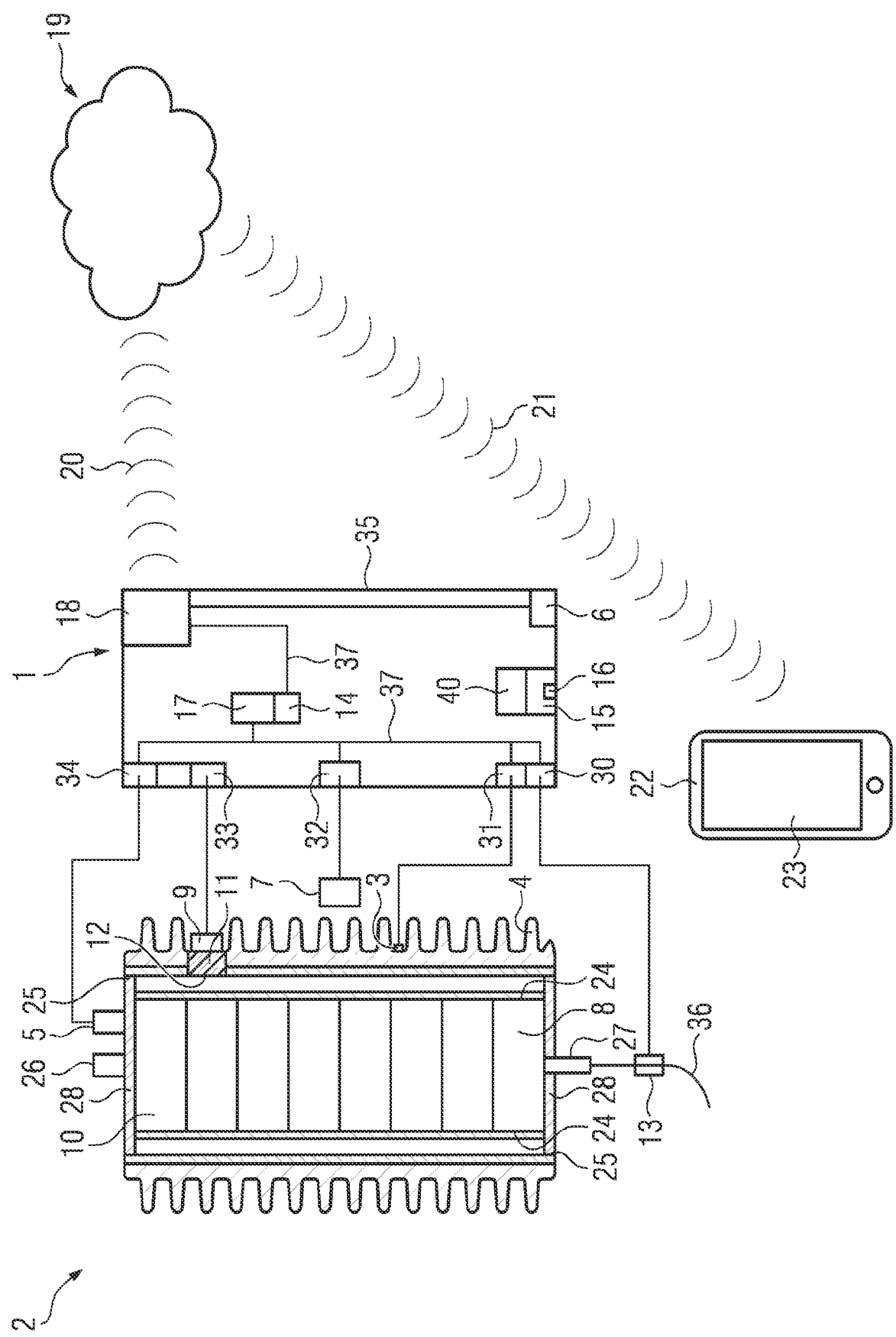

MONITORING ARRANGEMENT FOR ELECTRICAL EQUIPMENT, AND MONITORING SYSTEM

FIELD AND BACKGROUND OF THE INVENTION

The invention relates to a monitoring arrangement for electrical equipment and a monitoring system for electrical equipment having the monitoring arrangement.

Surge arresters are used in the medium-voltage and high-voltage range to safely discharge so-called overvoltages, i.e. voltages far above the rated voltages planned in operation, to earth. This prevents damage to equipment, such as transformers. For example, a high-voltage surge arrester can be arranged on an overhead line and in the event of a lightning strike or short-circuit, unacceptably high currents can be discharged to earth.

Surge arresters usually contain so-called varistors ("variable resistors"), i.e. electrical resistors, the electrical resistance value of which is very high up to a threshold voltage determined by the design and is greatly reduced above the threshold voltage, with the result that the surge arrester becomes a good electrical conductor. For example, metal oxide resistors in disk form are arranged on top of one another in a housing and connected to the high-voltage potential and the earth potential at the respective ends of the housing. In normal operation, the surge arrester is barely conductive, so that only a small leakage current flows to earth. In the event of an overvoltage, on the other hand, a high discharge current flows.

From pages 4-6 and 10 of the product brochure "A full range of monitoring Solutions for surge arresters", Siemens AG 2012, order No. E50001-G630-A141-V2-4A00, it is known to use the monitoring device "ACM advanced—Arrester Condition Monitoring" for monitoring surge arresters. It is connected to the earth cable of an arrester and has solar cells for its power supply. The device is equipped with a digital display device and a communication device that is designed for radio transmission of measured data into the immediate environment. Over-voltage pulses are recorded by sensors with regard to a maximum amplitude, pulse width and energy input, and are given a time stamp. In addition, the total leakage current is detected (3rd harmonic oscillation) and the total energy absorption of the arrester is determined. The device stores the measured values internally in a data store, so that information can be obtained at a later date from the history of the discharge processes.

In the course of the ever-increasing networking of devices on the internet, the so-called "Internet of Things", more and more devices are currently being directly connected to one another via machine-to-machine interfaces. In the field of industrial automation, for example, under the heading "Industry 4.0" production lines are simulated as so-called "cyber-physical systems" in order to be able to monitor and optimize the production of goods in real time.

In the field of energy technology also, it is desirable to be able to monitor devices such as high-voltage transformers that previously could not be remotely monitored, via external data communication. A device that transfers the sensor signals to an internet environment ("IoT device") is typically used to transmit and bundle sensor signals from the respective equipment acquired by means of sensors. Such devices are known from the data sheets "Sensformer™ Connectivity Device" and "Sensformer™ Connectivity Device, outdoor version". Both models have a limited number of inputs or interfaces (e.g. three analog and two digital inputs) as well as a range of communication options such as Ethernet, USB, or radio (GSM).

SUMMARY OF THE INVENTION

Based on the well-known "ACM advanced" system, the object of the invention is to specify a monitoring arrangement that enables accurate remote monitoring of electrical equipment in a relatively comprehensive and efficient manner.

The invention achieves this object by means of a monitoring arrangement including a first sensor for detecting a surface creeping current on a creeping path-lengthening electrically insulating housing of the equipment.

An item of electrical equipment in the sense of the invention is, for example, a surge arrester or an electrical insulator, e.g. a long-rod insulator. Items of equipment that have insulators and surge arresters, such as an EGLA ("externally gapped line arrester"), are also suitable.

In a preferred embodiment according to the invention, the monitoring arrangement comprises a computing device. The computing device has, for example, processor means and/or data storage means to combine the acquired sensor measurement data in digital form and prepare it for transmission.

In a preferred embodiment according to the invention, the first sensor has an electrically conductive electrode. For example, this can comprise a metal, i.e. at least partly consist of aluminum, copper, brass, stainless steel. As arresters are also used in outdoor areas, weather-resistant, i.e. corrosion-resistant, metals such as brass are preferred. For example, the electrode can be guided around the housing as a clamp or cuff or as a band, i.e. it completely encloses the housing around its circumference. Alternatively, a solution can be chosen in which the electrode covers only part of the circumference of the housing.

It is also preferred if the electrode is arranged on the earth side and has a predetermined minimum distance from the metallic end fitting. The electrode should rest completely on the insulated housing and can be arranged, for example, between two shields, i.e. in cross-section, so to speak in the valley between two mountains.

The first sensor and all other sensors which may be used according to the invention provide sensor measurement data. Depending on the type of sensor used, this data can be available in different data formats. In a preferred variant, all sensor measurement data can be combined by means of the computing device and prepared for transmission in a uniform data format. A computing device provided in a communication device of a monitoring system can also be used for this purpose.

In another preferred embodiment of the monitoring arrangement according to the invention, a second sensor is designed to detect a voltage applied to the equipment, wherein the second sensor evaluates the electrical and/or the magnetic field in the environment of the equipment. This is an advantage because overvoltages can be detected and counted in order to determine the thermal loading of the equipment over the lifetime. For example, a sensor for the electrical field can be used, which is preferably arranged near the earth potential.

If the second sensor is used near to the high-voltage potential, it can be supplied with electrical energy from surrounding electromagnetic radiation, for example, using so-called "energy harvesting", and the energy may be temporarily stored in an energy storage system. Sensor measurement data can be transmitted via radio link to other components of the monitoring arrangement so that isolation distances can be maintained.

Alternatively, or in addition, a sensor for voltage measurement can also be provided, which is galvanically connected to the current path.

The use of the second sensor enables in particular an evaluation of the higher harmonics (e.g. 3rd, 5th, 7th harmonic). Harmonics are produced by equipment with a non-linear characteristic, such as transformers. The non-sinusoidal currents of these consumers cause a voltage drop at the line impedance, which distorts the nominal line voltage. The 3rd harmonics (at a line frequency of 50 Hz, 3rd harmonics are obtained at 150 Hz) behave proportionally to the resistive components of the currents. This makes it possible to deduce information about the aging of the at least one varistor. In other words, the aging of the varistor is greater the stronger the 3rd harmonics are detected. By comparison with a previously determined characteristic or calibration measurement, the degree of aging of the at least one varistor can therefore be concluded from the measurement data of the second sensor. This enables a particularly accurate service life prediction for the surge arrester equipment.

In another preferred embodiment of the monitoring arrangement according to the invention, a service life recording device is provided which measures the service life of the equipment from the time of installation and sends a maintenance signal at the specified service milestones of the equipment. This is an advantage because as part of a monitoring system according to the invention such maintenance signals can be transmitted to a remote server device, in order to enable routine and automatical management of an entire fleet of equipment. For example, maintenance may include a visual inspection by a technician or by an autonomous drone to detect faults. If, for example, damage can be detected to a housing or insulator sheath, the equipment can be replaced. Such maintenance can be provided, for example, every second year after the equipment has been installed.

In another preferred embodiment of the monitoring arrangement according to the invention, a third sensor is designed for detecting acoustic signals in the environment of the equipment. This is an advantage because vibrations of the equipment can be detected. It can take the form of a microphone or a piezoelectric component, for example. The microphone is suitable for monitoring, for example, frequency ranges in the frequency range of between 20 and 20,000 Hertz audible to humans, so that e.g. electric arcs, rattling noises or mechanical vibrations at the nominal frequency of the line are detected.

In another preferred embodiment of the monitoring arrangement according to the invention, the equipment comprises an electrical insulator. It can be a long-rod insulator, for example.

In another preferred embodiment of the monitoring arrangement according to the invention, the equipment comprises a feed-through. It can be a feed-through or a bushing for a transformer, for example.

In another preferred embodiment of the monitoring arrangement according to the invention, the equipment comprises a surge arrester with at least one varistor.

In a further preferred embodiment of the monitoring arrangement according to the invention, a fourth sensor is provided for recording an operating temperature of a varistor.

For example, a surge arrester having a housing with a viewing window can be used. The viewing window is fitted with a transparent and infrared-permeable material and the fourth sensor has a measuring device for infrared light. The fourth sensor can automatically determine a temperature of the varistor from a measurement of a light intensity by means of a pre-determined calibration curve and supply this determined temperature. Alternatively, the fourth sensor can rely on the above-mentioned computing device to carry out this conversion. For example, the viewing window can be a round or rectangular opening in a fiberglass-reinforced plastic tube that surrounds a column of varistor disks. For example, the viewing window can be sealed off in a fluid-tight manner by a glass that is permeable to infrared light. For example, a photodiode or a thermal imaging camera can be used. A so-called "thermopile" for temperature measurement is particularly suitable, as is described on Wikipedia, for example (permanent link: https://en.wikipedia.org/w/index.php?title=Thermopile&oldid=890447398).

Alternatively or additionally, a temperature sensor can also be used, which is arranged directly on a varistor disk or between two varistors of the arrester column. For example, a disk-shaped device with the same diameter as the varistor disks can be used. Such a device with a so-called surface wave sensor is known from the publication EP 0 996 956 B1.

The temperature measured directly at the varistor can preferably be transmitted to a control center (e.g., a supervisory control and data acquisition (SCADA) system) of the energy supply network. For example, the monitoring system can be connected via Modbus or Ethernet to the control technology of a substation which forwards the temperature measurement data to the control center. Alternatively or additionally, the temperature measured directly on the varistor can be transmitted to the server device first and from there to the control center.

The measured temperature of the varistor is preferably evaluated in order to give an advance warning, on an initial threshold value of e.g. 200° C. being exceeded, that a so-called "thermal runaway" (i.e. a thermal overload of the arrester with failure of the device) is imminent. A control center technician can initiate countermeasures and, for example, schedule a shutdown of the relevant line section to prevent thermal overload. In addition, if a second threshold value of e.g. 230° C. is exceeded, an immediate shutdown of the line section on which the arrester is located can be triggered.

In a preferred extension of the above-mentioned embodiment of the monitoring arrangement according to the invention, the fourth sensor is designed for measuring an ambient temperature of the equipment. This is an advantage because it means the temperature difference of the varistor in relation to the environment can be determined.

In a further preferred embodiment of the monitoring arrangement according to the invention, a fifth sensor is provided for recording a leakage current of the surge arrester. For example, the fifth sensor can be arranged on the earth cable or, for example, on the earth-side end fitting.

In a further preferred embodiment of the monitoring arrangement according to the invention, the fifth sensor is designed to detect a total leakage current composed of a leakage current through the at least one varistor and a creeping current through the insulating housing.

In a further preferred embodiment of the monitoring arrangement according to the invention, the fifth sensor is designed for measuring DC currents and AC currents. This is an advantage because existing leakage current measuring devices are intended only for measuring AC currents. Leakage current measuring devices for alternating current are formed, for example, with an iron rod surrounded by a coil. However, such an inductive measuring device is unsuitable for measuring DC currents. In particular on overhead line masts for so-called hybrid lines with DC voltage lines and AC voltage lines on a common mast, a uniform monitoring arrangement can be advantageously used for equipment such as surge arresters.

In another preferred embodiment of the monitoring arrangement according to the invention the fifth sensor has an ohmic resistor and a spark gap, wherein a rectifier is provided for the rectification of AC currents. For example, a bridge rectifier can be used. This embodiment has the advantage that AC currents can also be measured using the rectifier.

In another preferred embodiment of the monitoring arrangement according to the invention, the fifth sensor comprises a Hall-type probe. For example, a metal bolt or the like can be used on which the Hall-type probe is arranged for detecting magnetic fields. Such a low-resistance design (the metal bolt has almost no electrical resistance to a first approximation) is advantageous because previous versions with electrical resistors often fail over extended periods of time.

In a further preferred embodiment of the monitoring arrangement according to the invention, a sixth sensor is designed to measure a density of an electrically insulating protective gas. In this case, a high-voltage arrester is typically monitored as the equipment. The arrester has a fluid-tight housing, e.g. made of metal, which is provided on the inside with one or more columns of varistor disks. The columns are often braced by means of fiberglass rods. The columns are electrically isolated from one another and from the housing by an electrically insulating protective gas. Sulfur hexafluoride (SF6) under pressure is often used, or alternatively purified and dehumidified air (so-called "Clean Air" systems, such as those offered by Siemens AG, for example). The gas density can be determined, for example, by means of pressure and temperature sensors on the basis of a gas equation of an ideal gas or similar. Particularly suitable are sensor types which can be operated without their own power supply from the electromagnetic field by means of so-called "energy-harvesting" and transmit their measured values via radio from the inside of the housing to the outside. If the gas density falls below a specified threshold value, the arrester can no longer be operated safely and must be switched off and replaced.

In a further preferred embodiment of the monitoring arrangement according to the invention, a seventh sensor is provided for detecting surge currents. Surge currents are short-term current surges with amplitudes of e.g. 100 A to 100 kA. The seventh sensor can perform an inductive current measurement, for example; a so-called Rogovski coil can preferably be used, which is arranged around the earth cable.

In another preferred embodiment of the monitoring arrangement according to the invention, a data store is provided for storing the measured values acquired by the sensors. The data store can be designed to buffer acquired sensor measurement data before transmission by means of a communication device. For example, an HDD or a RAM memory can be used. The advantage of this embodiment is that in the event of an interruption of the connection between the monitoring arrangement and a remote server device, the raw data collected can be buffered and sent later, after a connection has been restored.

In another preferred embodiment of the monitoring arrangement according to the invention, a power supply is provided that is designed to recover energy via an Ethernet connection. An alternative or additional energy supply can be provided by means of "energy harvesting" from ambient electromagnetic radiation by means of an energy-harvesting device. For outdoor use, a solar power supply can also be provided.

In a preferred embodiment of the monitoring arrangement according to the invention, a timestamp device is provided which is designed to assign a time stamp to each item of sensor measurement data. The timestamp indicates the time at which the respective measured values or sensor measurement data are acquired in the monitoring arrangement. Preferably, a single timestamp device can be provided to assign timestamps to all sensor measurement data generated at the different sensors. As an alternative, a plurality of timestamp devices can be provided, e.g. one timestamp device for each sensor. For example, the timestamps can be acquired with millisecond accuracy. They can also be acquired in the hundredths of a second or in the tenths of a second range.

It is particularly preferred if the timestamp device is synchronized with an external timer. For example, this can be achieved by receiving satellite time data, e.g. via a receiver device for the Global Positioning System (GPS), which are in turn synchronized with an atomic clock, for example. This results in the advantage that all sensor measurement data is acquired at the same time, regardless of where the monitoring instructions are each located. In addition, measurement data from different monitoring arrangements can be put into chronological order, which enables more precise calculations, for example, of network stability in a control center.

Because according to the invention the sensor measurement data is not usually evaluated locally in a hard-wired system, but remotely and centrally in a server device, slow data transmission or an interruption of the respective connection can occur, particularly when using radio connections and/or internet connections. Scenarios for interruption of the connection include, for example, a power failure in the low and/or medium voltage network and thus a failure of a GSM connection and/or a failure of a LAN connection. Alternatively, the Internet Service Provider experiences a system error and the internet connection is disrupted at the service provider end.

In such a case, after the connection has been restored, it is easily possible to bring the sensor measurement data into chronological order relative to newer sensor measurement data based on their time stamps and to resume planned evaluations on the server device.

Based on the well-known "ACM advanced" system, the object of the invention is to specify a monitoring system that enables accurate remote monitoring of electrical equipment in a relatively comprehensive and efficient manner.

The invention achieves this object by means of a monitoring system including an item of electrical equipment, a monitoring arrangement according to the invention, a communication device for transmitting data to a central server device, and a central server device which is configured to receive and evaluate the data. A preferred embodiment provides that the communication device is configured to transmit the data in at least one of the following ways: via Ethernet, USB, serial interface 1× RS485, IEC 61850 Standard, radio, GSM, 2G, 3G, 4G, 5G, long range radio, NFC, Bluetooth, W-LAN, fiber optic cables, powerline communication, Modbus, Modbus RTU, Modbus ASCII, Modbus TCP. The same advantages apply, mutatis mutandis, as those described above for the monitoring arrangement according to the invention. It is thus clear to the person skilled in the art that all the designs of the invention described in connection with the monitoring arrangement can also be applied in the monitoring system.

The server device can be, e.g., a central server device such as a data center or a cloud application. In the sense of the invention, a cloud application is to be understood to mean a computer program that uses networked resources (processors, data stores, etc.) via a data network such as the internet. Examples include Microsoft Azure, Amazon Web Services, or Siemens Mindsphere.

Alternatively, or in parallel, the server device can also be a decentralized server device; this can be understood, for example, as a computing device locally available in a substation.

In addition to or as an alternative to the above embodiment, a data exchange can also be provided between the server device and a control center to improve network management in the control center.

In a preferred embodiment of the monitoring system according to the invention, the communication device is designed for data communication with a network control center. For example, data communication according to the IEC 61850 standard can be provided. The advantage of this embodiment is that the sensor measurement data can be transmitted to a network control center or a control device for a substation via a direct connection. In this way, it is possible to feed directly into a "Supervisory Control and Data Acquisition" (SCADA) system, for example, without having to use the server device mentioned above. This allows the sensor measurement data to be used to control network operation. For example, the processed sensor measurement data in the control center can be used to quickly detect faults in electrical equipment such as surge arresters, which affect network operation. In particular, the measurement data can be used to estimate the severity of faults and thus the probability of failure of the electrical systems. Without the sensor measurement data evaluation, the control center would only be able to detect the failure of an electrical system once it has happened. A slow degradation, etc., would remain undetected.

In another example, data communication according to the Modbus protocol can also be provided. This is particularly advantageous within an electrical system such as a substation.

The server device can merge the sensor measurement data of a plurality of data processing arrangements centrally and thus provide cross-fleet monitoring of the operational state of the electrical equipment. On the server device, an app with a user interface can be provided, which displays in a so-called dashboard not only the information obtained from the sensor measurement data, but also the respective time of the data acquisition. A general overview of all electrical equipment of a network and/or customer is also provided, which, in addition to a description of any detected abnormality(ies), also displays the current live status (online/offline) of the respective monitoring arrangements.

In a preferred embodiment of the monitoring system according to the invention, a mobile device designed for data communication with the server device is provided. This can be a tablet, a mobile phone or a laptop, for example, wherein e.g. an LTE network is used for data communication. The mobile device is designed to display information about the operational state of the electrical systems. For example, a touch screen can be used. This approach represents a crucial advantage compared to classical control engineering systems.

Electrical equipment can thus be monitored conveniently, straightforwardly and from any location. It is also a simple matter to make comparisons between two or more items of electrical equipment to detect deviations from permissible operating parameters. Control and maintenance personnel can monitor the entire system status directly on site, e.g. within a substation, e.g. using tablets or notebooks. They can check the condition of the system once again immediately before an activity, such as a repair operation.

For example, a "Sensformer™ Connectivity Device" or a "Sensformer™ Connectivity Device, outdoor version" as described earlier can be used as the communication device.

In a preferred embodiment of the monitoring system according to the invention, the communication device is designed to transmit the sensor measurement data to another communication device of another monitoring arrangement. Accordingly, the monitoring arrangements involved are designed to receive data from other monitoring arrangements.

In cases where no connection to the server or the network control center is possible (weak infrastructure), this approach enables data also to be transmitted within the spatial distribution of the electrical systems. For example, this can be carried out in a substation via W-LAN, WAN, radio or via Ethernet. The transmission of the sensor measurement data takes place until a monitoring arrangement is reached which can establish a connection to the server device and/or to the network control center. This creates a dynamic transmission path. This method can also be used to reduce the effective transfer points into the data cloud. It is therefore also possible to set up specific monitoring arrangements that are intentionally unable to establish a connection to the server device and/or the network control center. In this case, all monitoring arrangements can use a common router to make contact with external systems. In the extreme case, the connection points are limited in such a way that a mesh network must be established. In this way, even greater distances can be covered before a connection to the server device and/or the network control center can be established.

In a preferred embodiment of the monitoring system according to the invention, the central server device is designed to determine a degree of contamination of the housing on the basis of a determined creeping current. Based on the degree of contamination, a next maintenance date can also be defined. This embodiment is particularly advantageous because in many regions of the world, particularly harsh environmental conditions can place a heavy load on the insulating equipment housings due to electrically conductive impurity layers. For this reason, customers in Egypt, for example, have the housings of equipment with porcelain jackets cleaned regularly by maintenance teams in order to remove sand and salt deposits and the like. It is also known from the Canary Islands that customers who use polymer housings perform regular cleaning and/or washdown operations. This ensures the safety of the equipment, as discharges of impurity layers can be avoided where housings have become contaminated. However, such operations are very labor-intensive, time-consuming and expensive. In addition, for reasons of occupational safety, the equipment in question must be powered down, which reduces the availability and reliability of the energy network. It is therefore a great advantage of the invention that no minimum cleaning interval needs to be defined for all of a customer's equipment in order to ensure safety. Instead, on the basis of the creeping current measurement, information can be obtained as to a degree of contamination, i.e., the type and thickness of the impurity layer, by comparison with calibration measurements and a prediction can be calculated about the future development of the contamination. This makes it possible to define an individual maintenance time for each item of equipment, because, for example, the degree of contamination has exceeded a permissible threshold value. This saves time and costs.

In a preferred embodiment of the monitoring arrangement according to the invention, a central server device is designed to determine the influence of direct sunlight on the housing temperature from a correlation between the measured leakage current through the at least one varistor with a measured housing temperature. This is an advantage because it means that a noticeable heating of the equipment on the outside (even without knowledge of a directly measured varistor temperature) can be recognized as not critical to safety, since the leakage current essentially remains within an expected range and does not increase. This is advantageous because false alarms related to the temperature of the arrester can be avoided. Even without direct measurement of the temperature of the varistor, a so-called "thermal runaway" of the varistor can be eliminated.

BRIEF DESCRIPTION OF THE FIGURES

For a better explanation of the invention, FIG. 1 shows a schematic drawing of an exemplary embodiment of the invention.

DETAILED DESCRIPTION OF THE INVENTION

A surge arrester 2 has a plurality of varistor disks 8, 10 or voltage-dependent resistors in its interior, which are stacked on top of one another to form an arrester column and are clamped between two end fittings 28. The clamping is produced in a so-called cage construction using tension elements 24. The tension elements 24 are, for example, rods made of glass-fiber-reinforced plastic (fiberglass). The arrester column which is clamped in this way is arranged in a tubular housing 25, which is surrounded by an electrically insulating housing 4 with a creeping-path-lengthening shielding. The creeping-path-lengthening shielding can be made from silicone rubber or porcelain, for example. In addition, the surge arrester 2 has a first connecting bolt 26. On the earth side, a second connecting bolt 27 is connected to an earth cable 36. The tube 25 and the insulating housing 4 have an opening 11 at one point in which a viewing window 12 is provided. The viewing window 12 is sealed in a fluid-tight manner with a transparent glass that is permeable to infrared light, made of a suitable glass or plastic, for example.

The surge arrester is monitored for a wide range of operating parameters by means of a monitoring arrangement 1. This has a first sensor 3, which is arranged on the creeping-path-lengthening shield for detecting a surface creeping current. This first sensor 3 is connected to an input 31 of a housing 35. A second sensor 5 is designed to detect a voltage applied to the surge arrester 2, and captures the electrical and/or magnetic field in the environment of the surge arrester 2. This second sensor 5 is connected to an input 34. A fourth sensor 9 is provided for detecting an operating temperature of a varistor 10. For this purpose, the sensor 9 has a measuring device for infrared light and is arranged on the viewing window 11. The fourth sensor 9 is connected to an input 33. A third sensor 7 is arranged in the vicinity of the surge arrester 2 and is designed to detect acoustic signals. This sensor 7 is connected to an input 32. A fifth sensor 13 is provided for detecting a leakage current of the surge arrester 2. The fifth sensor is designed to detect a total leakage current composed of a leakage current through the at least one varistor and a creeping current through the insulating housing. The fifth sensor may be designed for detecting DC currents and AC currents. The fifth sensor has an ohmic resistor and a spark gap, wherein a rectifier is provided for the rectification of AC currents, and the fifth sensor may be a Hall-type probe.

In the housing 35 of the monitoring arrangement 1, inputs 30-34 are connected to a computing device 17 via data communication lines 37. The latter has a data store 14. The sensor measurement data arriving at inputs 30-34 is transmitted to the computing device 17 and combined and pre-processed for transmission there. The computing device 17 is connected to a communication device 18 via an additional data communication line 37. The communication device 18 is designed for data transmission 20 via radio to a cloud application 19. A power supply 15, which is designed to recover energy via an Ethernet connection 16, and an energy storage device 40 are also provided in the housing 35. A service life recording device 6 is provided to measure the service life of the surge arrester 2 from the time of installation and to send a maintenance signal to the communication device 18 via an additional data communication line at specified service life milestones of the surge arrester. In the cloud application 19, which can be understood as a server device with decentralized resources, the sensor measurement data is further processed and presented in a structured manner, for example, as part of a fleet management system for a plurality of items of equipment to be monitored. This information can be transmitted to a mobile device 22 by means of data communication link 21. For example, the mobile device is a mobile phone or tablet. This has a display device 23, for example a touch screen. In this way, a maintenance technician can easily determine the operating state of the surge arrester 2 at any time and from any location and, if necessary, initiate maintenance or repair measures.

Previous monitoring systems such as the well-known "ACM advanced" do not have a plurality of inputs in order to be able to acquire a wide range of sensor measurement data at the same time. This is a great advantage over previous devices.

The invention claimed is:

1. A monitoring arrangement for electrical equipment, the monitoring arrangement comprising:
    a first sensor configured to detect a surface creeping current on a creeping path-lengthening electrically insulating housing of the equipment;
    a second sensor configured to detect a voltage applied to the equipment, said second sensor evaluating at least one of an electrical or magnetic field in an environment of the equipment, and said second sensor providing measurement data;
    third harmonics being determined from the measurement data, and a degree of aging of at least one varistor of a surge arrester of the equipment being determined based on the third harmonics.

2. The monitoring arrangement according to claim 1, wherein said first sensor has an electrically conductive electrode.

3. The monitoring arrangement according to claim 1, which further comprises a fourth sensor for detecting an operating temperature of a varistor.

4. The monitoring arrangement according to claim 3, wherein the surge arrester has a housing with a viewing window fitted with a transparent and infrared-permeable material, and said fourth sensor has a measuring device for infrared light.

5. The monitoring arrangement according to claim 1, which further comprises:
- a third sensor configured to detect acoustic signals in an environment of the equipment;
- a fourth sensor configured to detect an operating temperature of a varistor of a surge arrester of the equipment;
- a fifth sensor configured to detect a leakage current of the surge arrester;
- a sixth sensor configured to detect a density of an electrically insulating protective gas; and
- a data store for storing measured values acquired by said sensors.

6. The monitoring arrangement according to claim 1, which further comprises a service life recording device measuring a service life of the equipment from a time of installation and issuing a maintenance signal at specified service milestones of the equipment.

7. The monitoring arrangement according to claim 1, which further comprises a third sensor configured to detect acoustic signals in an environment of the equipment.

8. The monitoring arrangement according to claim 1, wherein the equipment has an electrical insulator.

9. The monitoring arrangement according to claim 1, wherein the equipment has a surge arrester with at least one varistor.

10. The monitoring arrangement according to claim 1, wherein the equipment has a surge arrester with at least one varistor, and a fifth sensor detects a leakage current of the surge arrester.

11. The monitoring arrangement according to claim 10, wherein said fifth sensor is configured to detect a total leakage current composed of a leakage current through at least one varistor of the surge arrester and a creeping current through the electrically insulating housing.

12. The monitoring arrangement according to claim 10, wherein said fifth sensor is configured for detecting DC currents and AC currents.

13. The monitoring arrangement according to claim 12, wherein said fifth sensor has an ohmic resistor and a spark gap, and a rectifier is provided for rectification of AC currents.

14. The monitoring arrangement according to claim 12, wherein said fifth sensor has a Hall-type probe.

15. The monitoring arrangement according to claim 1, wherein the equipment has a surge arrester with at least one varistor, and a sixth sensor is configured to detect a density of an electrically insulating protective gas.

16. The monitoring arrangement according to claim 1, which further comprises a power supply configured to recover energy via an Ethernet connection.

17. The monitoring arrangement according to claim 1, which further comprises an energy storage device for supplying energy.

18. A monitoring system, comprising:
- electrical equipment;
- a monitoring arrangement according to claim 1;
- a communication device for transmitting data; and
- a central server device configured to receive and evaluate the data transmitted by said communication device.

19. The monitoring system according to claim 18, wherein said communication device is configured to transmit the data via at least one way as follows: Ethernet, USB, serial interface 1× RS485, IEC 61850 Standard, radio, GSM, 2G, 3G, 4G, 5G, long range radio, NFC, Bluetooth, W-LAN, fiber optic cables, powerline communication, Modbus, Modbus RTU, Modbus ASCII or Modbus TCP.

20. The monitoring system according to claim 19, wherein said central server device is configured to determine a degree of contamination of the electrically insulating housing based on a determined creeping current.

* * * * *